United States Patent
Lee et al.

(10) Patent No.: US 12,433,078 B2
(45) Date of Patent: Sep. 30, 2025

(54) DISPLAY DEVICE HAVING DECREASED PROBAILLITY OF SHORT CIRCUITS

(71) Applicant: Samsung Display Co., LTD., Yongin-si (KR)

(72) Inventors: Ji Hye Lee, Yongin-si (KR); Kyung Bae Kim, Yongin-si (KR); Yong Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 761 days.

(21) Appl. No.: 17/669,869

(22) Filed: Feb. 11, 2022

(65) Prior Publication Data

US 2022/0336720 A1 Oct. 20, 2022

(30) Foreign Application Priority Data

Apr. 20, 2021 (KR) .......................... 10-2021-0051289

(51) Int. Cl.
| | |
|---|---|
| *H10K 59/10* | (2023.01) |
| *G09G 3/32* | (2016.01) |
| *H10H 20/857* | (2025.01) |
| *H10H 29/14* | (2025.01) |

(52) U.S. Cl.
CPC ............. *H10H 20/857* (2025.01); *G09G 3/32* (2013.01); *H10H 29/142* (2025.01)

(58) Field of Classification Search
CPC ..... H01L 33/62; H01L 27/156; H01L 25/167; H01L 25/0753; H01L 27/124; G09F 9/30; G09G 3/20; G09G 3/3225; G09G 3/3266; G09G 3/3275; G09G 2300/0426; G09G 3/32; H10K 59/131; H10H 20/857; H10H 29/142; H10D 86/441
See application file for complete search history.

(56) References Cited

U.S. PATENT DOCUMENTS

| | | |
|---|---|---|
| 10,748,978 B2 | 8/2020 | Lim |
| 10,790,348 B2 | 9/2020 | Lee |
| 2002/0089614 A1* | 7/2002 | Kim ...................... G02F 1/1309 349/40 |

(Continued)

FOREIGN PATENT DOCUMENTS

| | | |
|---|---|---|
| CN | 107492567 | 12/2017 |
| CN | 112670319 | 4/2021 |

(Continued)

OTHER PUBLICATIONS

Extended European search report for European Patent Application or Patent No. 22168901.1 dated Sep. 9, 2022.

*Primary Examiner* — Samuel Park
(74) *Attorney, Agent, or Firm* — Womble Bond Dickinson (US) LLP

(57) ABSTRACT

A display device includes a display area and a non-display area adjacent to the display area. The display device includes a pixel disposed in the display area; a driving controller disposed in the non-display area, the driving controller controlling driving of the pixel; and a line part having at least a portion disposed in the non-display area, the line part electrically connecting the pixel and the driving controller to each other between the pixel and the driving controller. The non-display area includes a fan-out area disposed between the display area and the driving controller.

20 Claims, 12 Drawing Sheets

(56) References Cited

U.S. PATENT DOCUMENTS

| | | | | |
|---|---|---|---|---|
| 2004/0095303 | A1* | 5/2004 | Moon | G09G 3/3648 |
| | | | | 345/87 |
| 2008/0157364 | A1* | 7/2008 | Yang | G02F 1/136286 |
| | | | | 257/E21.597 |
| 2011/0018858 | A1* | 1/2011 | Ryu | G09G 3/3233 |
| | | | | 345/82 |
| 2011/0221719 | A1* | 9/2011 | Kim | G09G 3/3648 |
| | | | | 345/204 |
| 2019/0074328 | A1* | 3/2019 | Park | G06F 3/0446 |
| 2020/0081583 | A1* | 3/2020 | Na | G06F 3/0412 |
| 2020/0175917 | A1* | 6/2020 | Jo | H10K 59/131 |
| 2021/0098550 | A1 | 4/2021 | Moon et al. | |
| 2021/0118958 | A1 | 4/2021 | Park et al. | |
| 2022/0254816 | A1 | 8/2022 | Park et al. | |

FOREIGN PATENT DOCUMENTS

| | | |
|---|---|---|
| KR | 10-2019-0025120 A | 3/2019 |
| KR | 10-2019-0069955 A | 6/2019 |
| KR | 10-2022-0115712 | 8/2022 |

* cited by examiner

FIG. 11
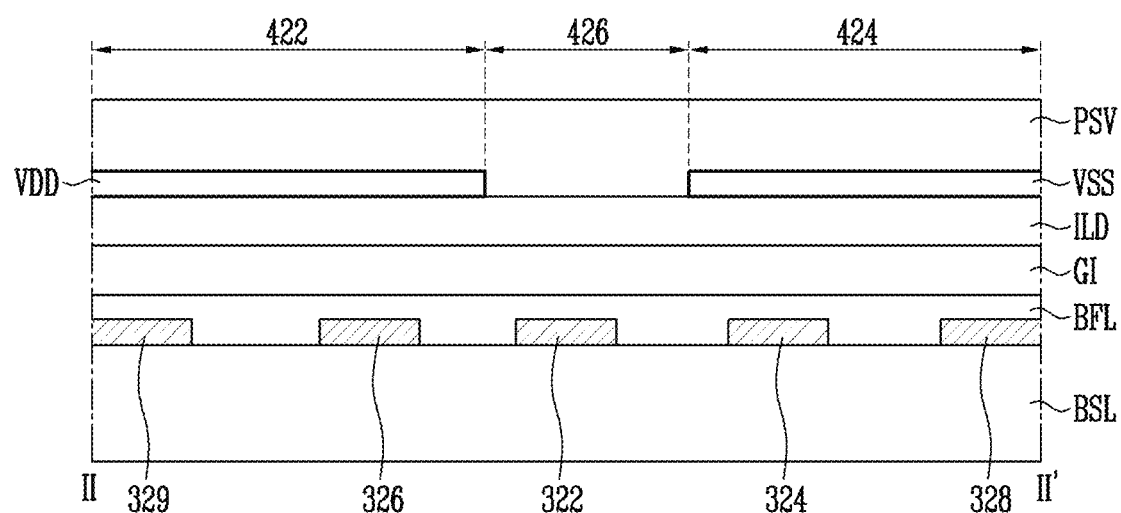

FIG. 13
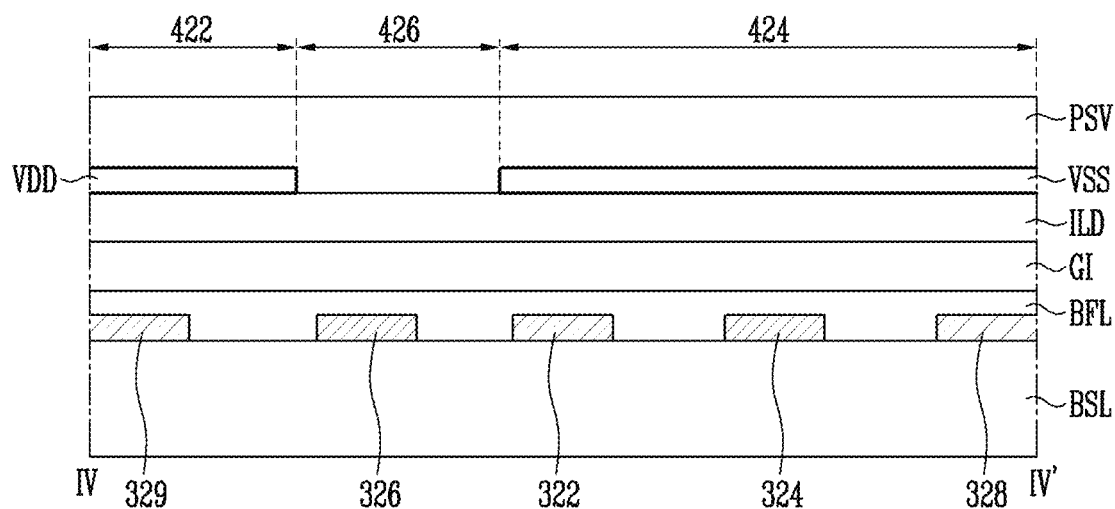

DISPLAY DEVICE HAVING DECREASED PROBAILLITY OF SHORT CIRCUITS

CROSS-REFERENCE TO RELATED APPLICATION(S)

This application claims priority to and benefits of Korean Patent Application No. 10-2021-0051289 under 35 U.S.C. § 119 filed on Apr. 20, 2021, in the Korean Intellectual Property Office, the entire contents of which are incorporated herein by reference.

BACKGROUND

1. Technical Field

The disclosure generally relates to a display device.

2. Description of the Related Art

Recently, as interest in information displays is increased, research and development of display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device which can decrease a resistance deviation for each of positions of lines and prevent a short-circuit defect between electrode components.

A display device may include a display area and a non-display area adjacent to the display area; a pixel disposed in the display area; a driving controller disposed in the non-display area, the driving controller controlling driving of the pixel; and a line part having at least a portion disposed in the non-display area, the line part electrically connecting the pixel and the driving controller to each other between the pixel and the driving controller, wherein the non-display area may include a fan-out area located between the display area and the driving controller, wherein the non-display area may include a fan-out area disposed between the display area and the driving controller, the line part may include a first power line; a second power line; and a fan-out line, at least a portion of each of which is disposed in the fan-out area, wherein at least a portion of the first power line and at least a portion of the second power line are spaced apart from each other by a separation area extending in an oblique direction in a plan view, and wherein a side of the display device, adjacent to the driving controller, and the oblique direction are non-parallel to each other.

The first power line and the second power line may have a substantially plate shape in a plan view. The first power line may include a first adjacent line adjacent to the second power line, and the second power line may include a second adjacent line adjacent to the first power line. The first power line and the second power line may not overlap each other in a plan view.

The first adjacent line and the second adjacent line may be parallel to each other.

The first adjacent line and the second adjacent line may be dislocated from the side of the display device adjacent to the driving controller.

The first adjacent line and the second adjacent line may have a substantially stepped shape.

The first power line and the second power line may be disposed in a same layer different from a layer of the fan-out line.

The display device may further include a transistor electrically connected to the driving controller, the transistor including a first transistor electrode and a second transistor electrode. The first transistor electrode, the second transistor electrode, the first power line, and the second power line may be disposed in a same layer.

The display device may further include a barrier electrode layer overlapping at least a portion of the transistor in a plan view. The barrier electrode layer and the fan-out line may be disposed in a same layer.

At least a portion of the fan-out line may overlap the separation area in a plan view.

The fan-out line may include a first fan-out line; a second fan-out line; and a third fan-out line. The first fan-out line, the second fan-out line, and the third fan-out line may be spaced apart from each other in a first direction. At least a portion of each of the first fan-out line, the second fan-out line, and the third fan-out line may extend in a second direction.

The fan-out area may include a first area, a second area, and a third area. The first area, the second area, and the third area may be spaced apart from each other in the second direction in a plan view. The first area may be disposed between the second area and the third area.

The second direction may be a direction toward the display area from the driving controller.

The fan-out area may include a first overlapping area and a second overlapping area. The first power line may overlap the fan-out line in the first overlapping area, and the second power line may overlap the fan-out line in the second overlapping area.

The first fan-out line may overlap the separation area in the first area in a plan view, and the second fan-out line and the third fan-out line may not overlap the separation area in the first area in a plan view.

The second fan-out line may overlap the separation area in the second area in a plan view, and the first fan-out line and the third fan-out line may not overlap the separation area in the second area in a plan view.

The third fan-out line may overlap the separation area in the third area in a plan view, and the first fan-out line and the second fan-out line may not overlap the separation area in the third area in a plan view.

The second fan-out line may overlap the second overlapping area, and the third fan-out line may overlap the first overlapping area in a plan view in the first area. The first fan-out line may overlap the first overlapping area, and the third fan-out line may overlap the first overlapping area in a plan view in the second area. The first fan-out line may overlap the second overlapping area, and the second fan-out line may overlap the second overlapping area in a plan view in the third area.

The driving controller drives the pixel and may include a scan driver; a data drive; and a compensator. The scan driver, the data driver, and the compensator may be disposed at a side of the display area.

A width of the fan-out area may be widened in a direction towards the display area from the driving controller.

The fan-out line may include at least one of a scan line, a data line, and a sensing line, electrically connected to the pixel.

BRIEF DESCRIPTION OF THE DRAWINGS

The above and other aspects and features of the disclosure will become more apparent by describing in detail embodiments thereof with reference to the attached drawings, in which:

FIG. 11 is a schematic cross-sectional view taken along line II-II' shown in FIG. 10.

FIG. 13 is a schematic cross-sectional view taken along line IV-IV' shown in FIG. 10.

DETAILED DESCRIPTION OF THE EMBODIMENTS

Figure 1:
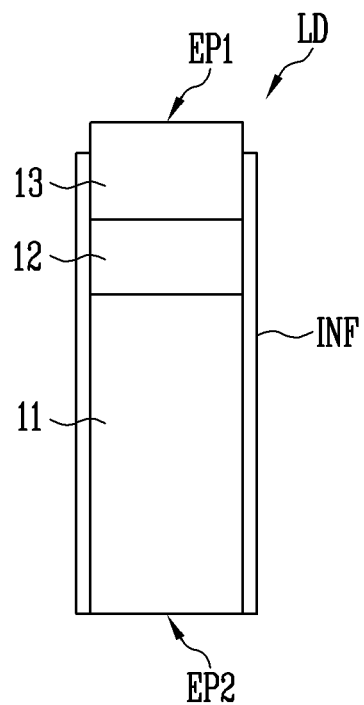
FIGS. 1 and 2 are sectional and schematic perspective views illustrating a light emitting element in accordance with an embodiment.

Embodiments disclosed in the specification are provided only for illustrative purposes and for a full understanding of the scope of the disclosure by those skilled in the art. However, the disclosure is not limited to the embodiments, and it should be understood that the disclosure includes modification examples or change examples without departing from the spirit and scope of the disclosure.

Thus, example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

For example, in the drawings, sizes, thicknesses, ratios, and dimensions of the elements may be exaggerated for ease of description and for clarity.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The drawings attached to the specification are provided to readily explain the disclosure, and the shapes shown in the drawings may be exaggerated and displayed as necessary to help understanding of the disclosure, and thus the disclosure is not limited to the drawings.

In the specification, when it is determined that a detailed description of a related configuration or function related to the disclosure may obscure the gist of the disclosure, a detailed description thereof will be omitted as necessary.

The disclosure generally relates to a display device. Hereinafter, a display device in accordance with an embodiment will be described with reference to FIGS. 1 to 13.

Figure 2:
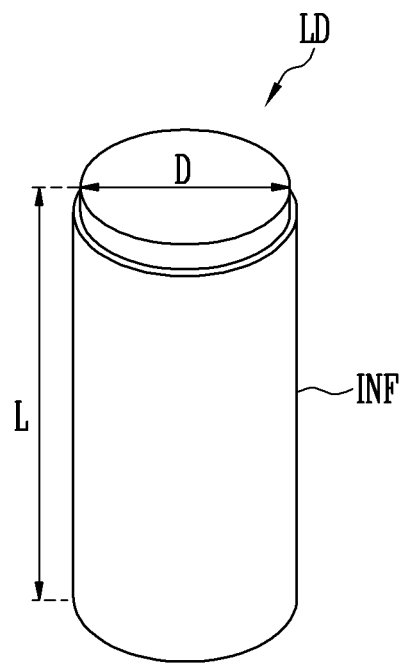

A light emitting element LD included in a display device (see '100' shown in FIG. 3) in accordance with an embodiment is illustrated in FIGS. 1 and 2. FIGS. 1 and 2 are sectional and schematic perspective views illustrating a light emitting element in accordance with an embodiment. Although a pillar-shaped light emitting element LD is illustrated in FIGS. 1 and 2, the kind and/or shape of the light emitting element LD are/is not limited thereto.

Referring to FIGS. 1 and 2, the light emitting element LD may include a first semiconductor layer 11, a second semiconductor layer 13, and an active layer 12 interposed between the first and second semiconductor layers 11 and 13. In an example, in case that assuming that an extending direction of the light emitting element LD is a length L direction, the light emitting element LD may include the first semiconductor layer 11, the active layer 12, and the second semiconductor layer 13, which may be sequentially stacked each other along the length L direction.

The light emitting element LD may be provided in a pillar shape or substantially pillar shape extending along one direction or a direction. The light emitting element LD may have a first end portion EP1 and a second end portion EP2. One of the first and second semiconductor layers 11 and 13 may be adjacent to the first end portion EP1 of the light emitting element LD. The other of the first and second semiconductor layers 11 and 13 may be adjacent to the second end portion EP2 of the light emitting element LD.

In accordance with an embodiment, the light emitting element LD may be a light emitting element manufactured in a pillar shape or substantially pillar shape through an etching process, etc. within the spirit and the scope of the disclosure. In this specification, the term "pillar shape" may include a rod-like shape or bar-like shape, which may be long in the length L direction (for example, its aspect ratio is greater than 1), such as a cylinder or a polyprism, and the shape of its section is not particularly limited. For example, a length L of the light emitting element LD may be greater than a diameter D (or a width of a cross-section) of the light emitting element LD.

In accordance with an embodiment, the light emitting element LD may have a size of nanometer scale to micrometer scale. For example, the diameter D and/or the length L of the light emitting element LD may have a size of nanometer scale to micrometer scale. However, the size of the light emitting element LD is not limited thereto.

The first semiconductor layer 11 may be a first conductivity type semiconductor layer. For example, the first semiconductor layer 11 may include an N-type semiconductor layer. In an example, the first semiconductor layer 11 may include any one semiconductor material among InAlGaN, GaN, AlGaN, InGaN, AlN, and InN, and include an N-type semiconductor layer doped with a first conductivity type dopant such as Si, Ge or Sn. However, the material constituting the first semiconductor layer 11 is not limited thereto. The first semiconductor layer 11 may be formed of various materials.

The active layer 12 is formed on the first semiconductor layer 11, and may be formed in a single-quantum well structure or a multi-quantum well structure. The position of the active layer 12 may be variously changed according to a kind of the light emitting element LD.

In an embodiment, a clad layer (not shown) doped with a conductive dopant may be formed on the top and/or the bottom of the active layer 12. In an example, the clad layer may be formed as an AlGaN layer or InAlGaN layer. In an embodiment, a material such as AlGaN or AlInGaN may be used to form the active layer 12. The active layer 12 may be formed of various materials.

The second semiconductor layer 13 is formed on the active layer 12, and may include a semiconductor layer having a type different from that of the first semiconductor layer 11. For example, the second semiconductor layer 13 may include a P-type semiconductor layer. In an example, the second semiconductor layer 13 may include at least one semiconductor material among InAlGaN, GaN, AlGaN, InGaN, AlN, and InN, and include a P-type semiconductor layer doped with a second conductivity type dopant such as Mg. However, the material constituting the second semiconductor layer 13 is not limited thereto. The second semiconductor layer 13 may be formed of various materials.

In case that a voltage which is a threshold voltage or more is applied to both ends of the light emitting element LD, the light emitting element LD emits light as electron-hole pairs are combined in the active layer 12. The light emission of the light emitting element LD is controlled by using such a principle, so that the light emitting element LD can be used as a light source for various light emitting devices, including a pixel of a display device.

In accordance with an embodiment, the light emitting element LD may further include an insulative film INF provided on a surface thereof. The insulative film INF may be formed on the surface of the light emitting element LD to surround an outer circumferential surface of at least the active layer 12. The insulative film INF may further surround one area or an area of each of the first and second semiconductor layers 11 and 13. The insulative film INF may be formed as a single film or a double film. However, the disclosure is not limited thereto, and the insulative film INF may be formed of films. In an example, the insulative film INF may include a first insulative film including a first material and a second insulative film including a second material different from the first material.

In accordance with an embodiment, the insulative film INF may expose both the end portions of the light emitting element LD, which have different polarities. For example, the insulative film INF may expose one end or an end of each of the first and second semiconductor layers 11 and 13 located or disposed at the first and second end portions EP1 and EP2 of the light emitting element LD. In an embodiment, the insulative film INF may expose a side portion of each of the first and second semiconductor layers 11 and 13 adjacent to the first and second end portions EP1 and EP2 of the light emitting element LD, which have different polarities.

In accordance with an embodiment, the insulative film INF may be formed as a single layer or a multi-layer, including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the disclosure is not limited thereto. For example, in accordance with an embodiment, the insulative film INF may be omitted.

In accordance with an embodiment, the insulative film INF ensures the electrical stability of the light emitting element LD and minimizes a surface defect of the light emitting element LD, thereby improving the lifetime and efficiency of the light emitting element LD.

In accordance with an embodiment, the light emitting element LD may additionally include at least one phosphor layer, at least one active layer, at least one semiconductor layer, and/or at least one electrode layer, which are disposed at one ends of the first semiconductor layer 11, the active layer 12, and/or the second semiconductor layer 13. In an example, a contact electrode layer may be further disposed at each of the first and second end portions EP1 and EP2 of the light emitting element LD. However, the structure of the light emitting element LD is not limited to the above-described example.

Figure 3:
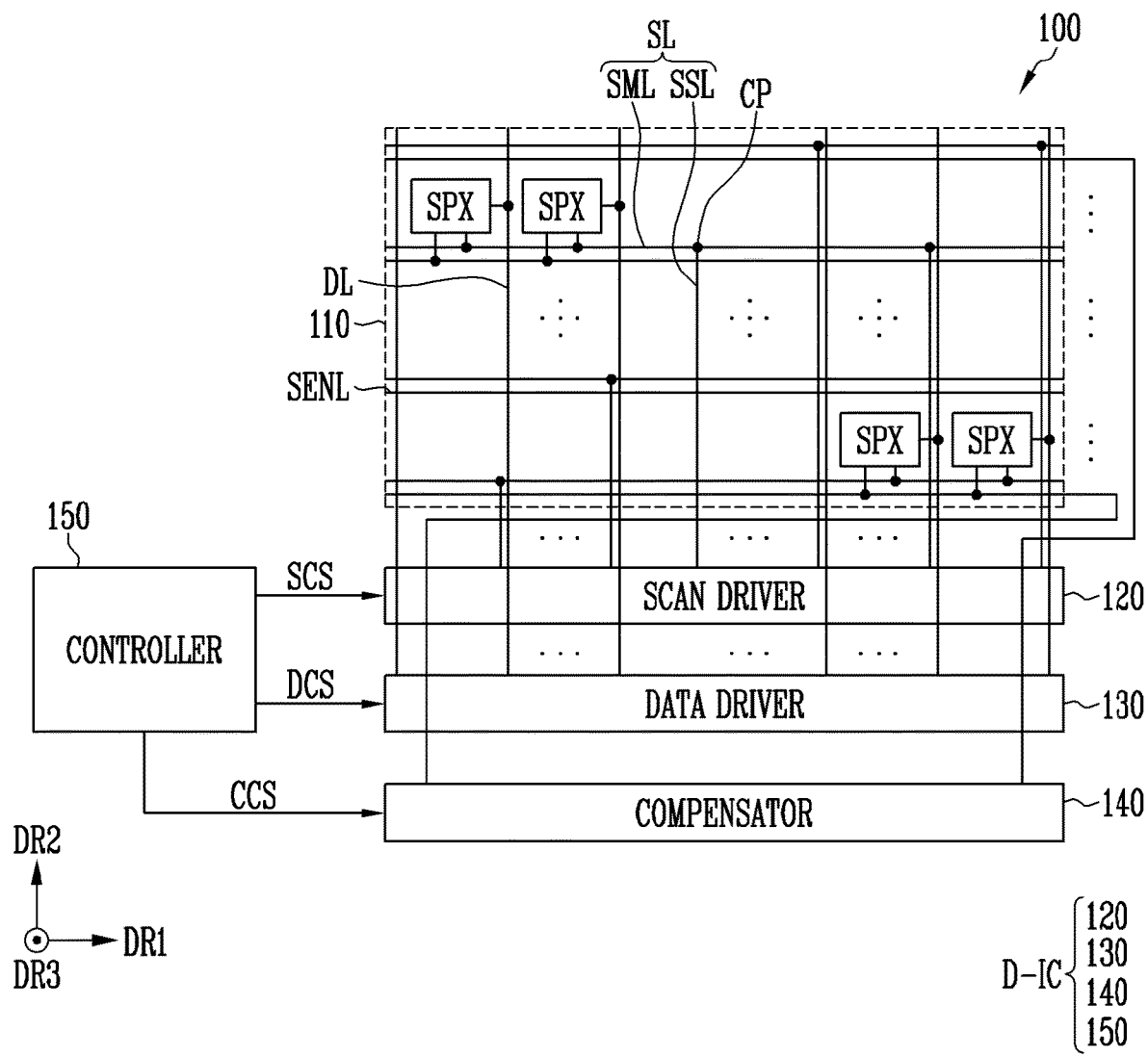
FIG. 3 is a block diagram illustrating a display device in accordance with an embodiment.

FIG. 3 is a block diagram illustrating a display device in accordance with an embodiment.

The display device 100 may mean a device that outputs optical data. The display device 100 may be an electronic device using, as a light source, the light emitting element LD described above with reference to FIGS. 1 and 2. In accordance with an embodiment, the display device 100 may be a tablet PC, a television, a smartphone, a notebook computer, or the like, but the disclosure is not limited thereto.

In accordance with an embodiment, the display device 100 may include a pixel or pixel unit 110 and a driving controller D-IC. In accordance with an example, the driving controller D-IC may include a scan driver 120, a data driver 130, a compensator 140, and a controller 150.

Figure 4:
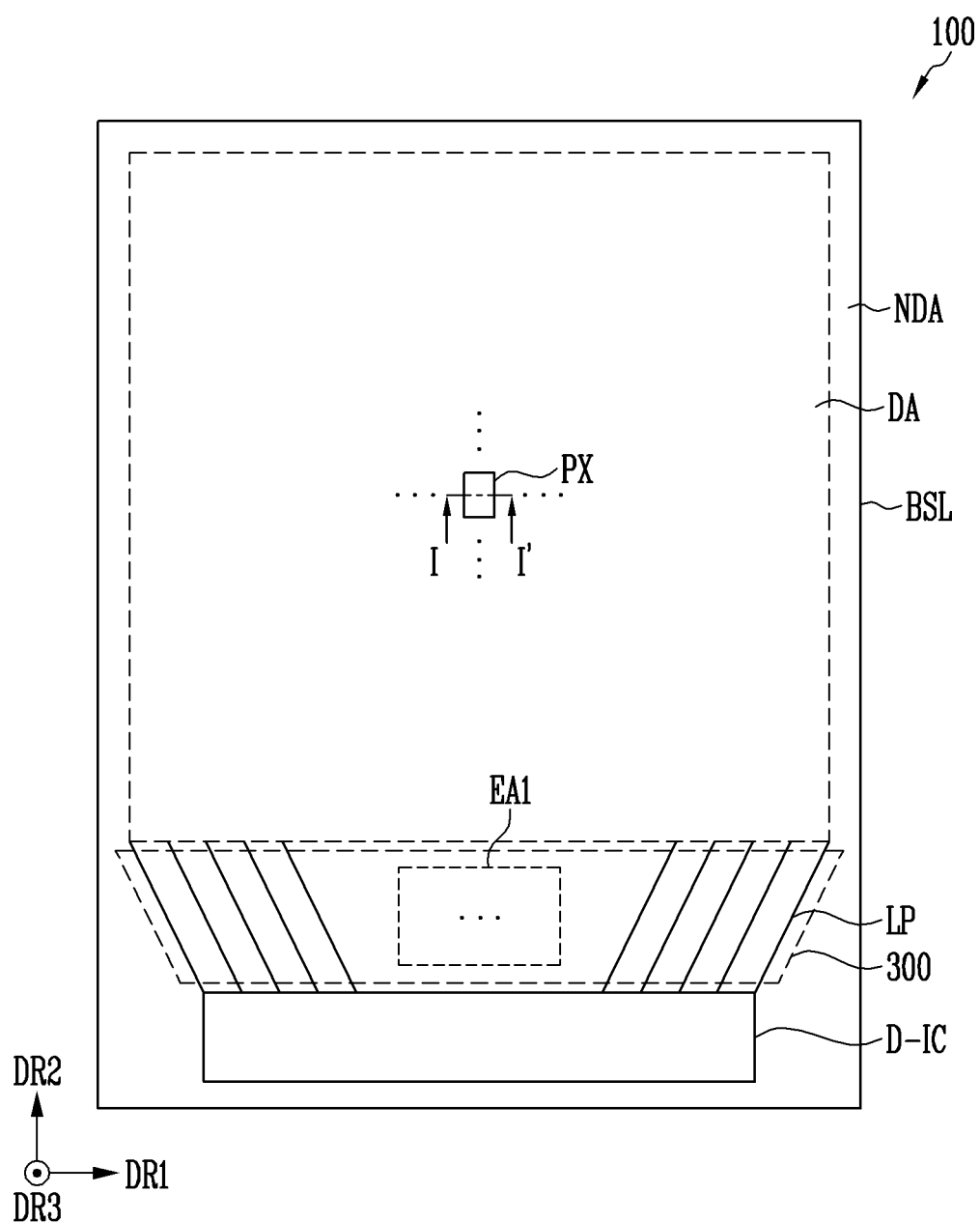
FIG. 4 is a schematic plan view illustrating a display device in accordance with an embodiment.

The pixel unit 110 may include pixels (see 'PX' shown in FIG. 4). The pixel unit 110 may include sub-pixels SPX connected to scan lines SL and data lines DL.

In accordance with an embodiment, at least one of the sub-pixels SPX may constitute the pixel PX. Sub-pixels SPX may constitute one pixel PX. In an example, the sub-pixels SPX may include a first sub-pixel to emit red light, a second sub-pixel to emit green light, and a third sub-pixel to emit blue light. The color and configuration of light emitted from each of the sub-pixels SPX.

The scan driver 120 may be disposed at one side or a side of the pixel unit 110. The scan driver 120 may receive a first control signal SCS from the controller 150. The scan driver 120 may supply a scan signal to scan lines SL in response to the first control signal SCS.

In accordance with an embodiment, the first control signal SCS may be a signal for controlling a driving timing of the scan driver 120. The first control signal SCS may include a scan start signal for a scan signal and a clock signal or clock signals. The scan signal may be set to a gate-on level corresponding to the type of a transistor (for example, first to third transistors (see 'T1 to T3' shown in FIG. 5)) to which the corresponding scan signal is supplied.

The data driver 130 may be disposed at one side or a side of the pixel unit 110. The data driver 130 may receive a second control signal DCS from the controller 150. The data driver 130 may supply a data signal to the data line DL in response to the second control signal DCS.

In accordance with an embodiment, the second control signal DCS may be a signal for controlling a driving timing of the data driver 130.

The compensator 140 may be disposed at one side or a side of the pixel unit 110. The compensator 140 may be supplied with a sensing value (current or voltage information) extracted from a sub-pixel SPX through the sensing line SENL. The compensator 140 may generate a compensation value for compensating for degradation of the sub-pixel SPX, based on the sensing value. For example, the compensator 140 may acquire information on a characteristic change of the first transistor (see 'T1' shown in FIG. 5) and/or the light emitting element LD (for example, a threshold voltage change, a mobility change, and other characteristic changes of the first transistor T1). The compensator 140 may calculate a compensation value for compensating for a data signal, based on the information on the characteristic change, and provide the calculated compensation value to the controller 150 or the data driver 130.

In accordance with an embodiment, the compensator 140 may receive a third control signal CCS from the controller 150. The compensator 140 may supply a sensing signal to the sub-pixel SPX in response to the third control signal CCS.

In accordance with an embodiment, the third control signal CCS may be a signal for controlling driving of the compensator 140 for sensing and degradation compensation of the sub-pixels SPX.

The controller 150 may acquire the first control signal SCS, the second control signal DCS, and the third control signal CCS. The controller 150 may generate the first control signal SCS and the second control signal DCS, and provide the first control signal SCS and the second control signal DCS respectively to the scan driver 120 and the data driver 130. The controller 150 may generate the third control signal CCS, and provide the third control signal CCS to the compensator 140.

In accordance with an embodiment, a single side driving structure may be provided, in which the scan driver 120, the data driver 130, and the compensator 140 are disposed at one side or a side of the pixel unit 110. Hereinafter, for convenience of description, the display device 100 including the single side driving structure will be described.

In accordance with an embodiment, in order to apply the single side driving structure to the display device 100, the scan line SL may include a main scan line SML and a sub-scan line SSL.

The main scan line SML may be connected to at least one sub-scan line SSL. For example, as shown in FIG. 3, two sub-scan lines SSL may be electrically connected to one main scan line SML.

The main scan line SML may extend in a first direction DR1, to be connected to a sub-pixel SPX of a pixel row corresponding thereto. The main scan line SML may supply a scan signal to the sub-pixel SPX.

The sub-scan line SSL may extend in a second direction DR2, to be connected to the main scan line SML at a contact part CP. The sub-scan line SSL may electrically connect the scan driver 120 and the main scan line SML to each other.

In accordance with an embodiment, in the single side driving structure, the scan driver 120 and the data driver 130 are disposed at a same side, so that data lines DL and sub-scan lines SSL can extend in a same direction (for example, the second direction DR2).

A pixel row direction is a horizontal direction, and may mean the first direction DR1. A pixel column direction is a vertical direction, and may mean the second direction DR2. Pixel rows and pixel columns may be defined by the arrangement of sub-pixels SPX. The pixel row may be defined by the main scan line SML.

The data line DL may extend along the pixel column (for example, the second direction DR2), to be connected to a sub-pixel SPX. The data line DL may supply a data signal to the sub-pixel SPX connected thereto.

In FIG. 3, the scan driver 120, the data driver 130, the compensator 140, and the controller 150 are illustrated to be distinguished from each other. However, at least some of the scan driver 120, the data driver 130, the compensator 140, and the controller 150 may be integrated as one module or one integrated circuit (IC) chip. For example, at least some components and/or at least some functions of the controller 150 may be included in the data driver 130.

Although not shown in the drawing, in an embodiment, the scan driver 120 may include of scan drivers (for example, scan driving chips or scan driving circuits), each of which takes charge of driving of a partial area of the pixel unit 110. The data driver 130 may be formed of data drivers (for example, data driving chips or data driving circuits), each of which takes charge of driving of a partial area of the pixel unit 110.

FIG. 4 is a schematic plan view illustrating a display device in accordance with an embodiment.

Referring to FIG. 4, the display device 100 may include a base layer BSL and pixels PX each including a light emitting element LD. In accordance with an embodiment, the display device 100 may include a display area DA and a non-display area NDA. The display device 100 may include a driving controller D-IC and a line part LP.

The base layer BSL may constitute a base member of the display device 100. In accordance with an example, the base layer BSL may be a rigid or flexible substrate or film, but the disclosure is not limited thereto.

The pixel unit 110 may be disposed in the display area DA. The display area DA may mean an area in which the pixel PX is disposed. Light may be emitted in the display area DA. The non-display area NDA may mean an area in which the pixel PX is not disposed. The non-display area NDA may mean an area except the display area DA. In an example, the non-display area NDA may be provided in a shape surrounding at least a portion of the display area DA or adjacent to the display area DA.

In accordance with an embodiment, the driving controller D-IC and the line part LP may be disposed in the non-display area NDA. Although not shown in the drawing, in accordance with an example, a pad part which electrically connects the driving controller D-IC and the line part LP to each other may be further disposed in the non-display area NDA.

The pixel PX may be disposed in the display area DA. The pixels PX may be regularly arranged or disposed according to a stripe or PENTILE™ arrangement structure, etc. within the spirit and the scope of the disclosure. However, the arrangement structure of the pixels PX is not limited thereto.

In accordance with an embodiment, the pixel PX may be connected to the driving controller D-IC through the line part LP. The line part LP may include a fan-out line (see '320' shown in FIG. 8), a first power line (see 'VDD' shown in FIG. 5), and a second power line (see 'VSS' shown in FIG. 5). The fan-out line 320 may include a scan line SL, a data line DL, and a sensing line SENL.

The driving controller D-IC may provide the pixel PX with a signal and a power source. The pixel PX may be driven based on the signal and the power source. The signal and power source, which are applied from the driving controller D-IC may be applied to the pixel PX via the line part LP. In accordance with an embodiment, the pixel PX may be driven based on an electrical signal provided from the scan line SL, the data line DL, the sensing line SENL, the first power line VDD, and the second power line VSS.

The line part LP may be disposed in the non-display area NDA. The line part LP may surround at least a portion of the display area DA. In accordance with an example, at least a portion of the line part LP may be disposed between the display area DA and the driving controller D-IC. In FIG. 4, it has been illustrated that the line part LP is disposed only between the display area DA and the driving controller D-IC, but the disclosure is not limited thereto. In an embodiment, the line part LP may be disposed at a position adjacent to the display area DA.

In accordance with an embodiment, the line part LP may electrically connect the driving controller D-IC and the pixel PX to each other. In accordance with an example, the line part LP may include at least a portion of each of the scan line SL, the data line DL, the first power line VDD, and/or the second power line VSS.

In accordance with an embodiment, the line part LP may include a fan-out area 300. The line part LP may include the fan-out line 320 disposed in the fan-out area 300. In a plan view, the fan-out area 300 may be disposed between the display area DA and the driving controller D-IC.

In accordance with an example, in a plan view, the fan-out line 320 corresponds to lines disposed in the fan-out area 300, and may include at least a portion of each of the scan line SL, the data line DL, and the sensing line SENL.

In accordance with an embodiment, at least a portion of each of the first power line VDD and the second power line VSS may be disposed in the fan-out area 300.

In accordance with an embodiment, the fan-out area 300 may have a shape which may be widened along one direction or a direction. The fan-out area 300 may have different widths along the second direction DR2. For example, the width of the fan-out area 300 may be widened as approaching the display area DA from the driving controller D-IC.

Figure 5:
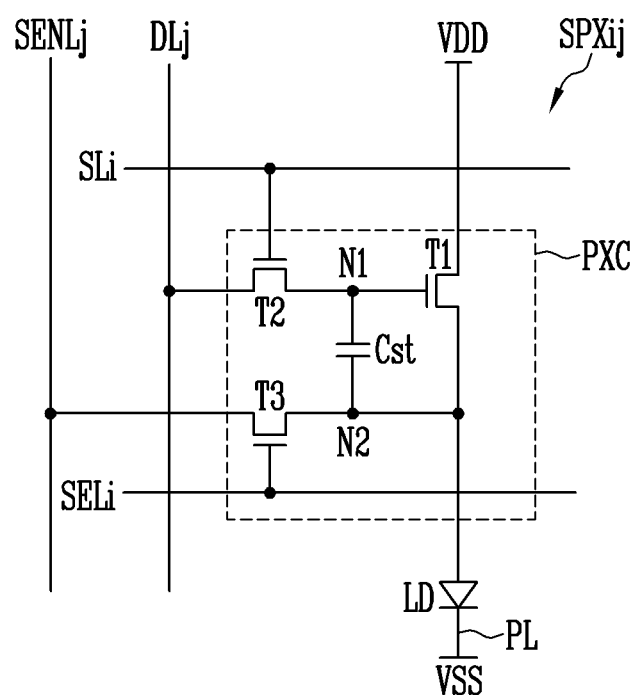
FIG. 5 is a schematic diagram of an equivalent circuit illustrating a pixel circuit included in a pixel in accordance with an embodiment.

FIG. 5 is a circuit diagram illustrating a pixel circuit included in a pixel in accordance with an embodiment.

A sub-pixel SPXij shown in FIG. 5 is any one of the sub-pixels SPX described above with reference to FIG. 3, and may mean a sub-pixel SPX connected to an ith scan line SLi, a jth data line DLj, a first sensing signal line SELi, and a jth sensing line SENLj (i and j are natural numbers).

Referring to FIG. 5, the sub-pixel SPXij may include a light emitting element LD and a pixel circuit PXC.

The light emitting element LD may be connected between a first power line VDD and a second power line VSS. One end portion or an end portion (for example, a P-type semiconductor) of the light emitting element LD may be connected to the first power line VDD via the pixel circuit PXC, and the other end portion or another end portion (for example, an N-type semiconductor) of the light emitting element LD may be connected to the second power line VSS via a power line PL.

In accordance with an embodiment, in case that a driving current is supplied through the pixel circuit PXC, the light emitting element LD may emit light with a luminance corresponding to the driving current.

In accordance with an embodiment, light emitting elements LD may be connected to each other through various connection structures between the first power line VDD and the second power line VSS. In an example, the light emitting elements LD may be connected only in parallel to each other or be connected only in series to each other. As an example, the light emitting elements LD may be connected in a series/parallel hybrid structure.

The first power line VDD and the second power line VSS may have different potentials such that the light emitting elements LD can emit light. For example, the first power line VDD may be set to a potential higher than that of the second power line VSS. In accordance with an embodiment, the first power line VDD and the second power line VSS may have a potential difference to a degree to which the light emitting elements LD can emit light during an emission period of the sub-pixel SPXij.

The pixel circuit PXC may connect the first power line VDD and the light emitting element LD to each other between the first power line VDD and the light emitting element LD. The pixel circuit PXC may include a first transistor T1, a second transistor T2, a third transistor T3, and a storage capacitor Cst.

One electrode of the first transistor T1 may be connected to the first power line VDD, and the other electrode of the first transistor T1 may be connected to one electrode (for example, an anode electrode) of the light emitting element LD. A gate electrode of the first transistor T1 may be connected to a first node N1. The first transistor T1 may control a current flowing through the light emitting element LD, corresponding to a voltage applied through the first node N1.

One electrode of the second transistor T2 may be connected to the jth data line DLj, and the other electrode of the second transistor T2 may be connected to the first node N1. A gate electrode of the second transistor T2 may be connected to the ith scan line SLi. The second transistor T2 may be turned on in case that a scan signal is supplied to the ith scan line SLi, to transfer a data signal provided from the jth data line DLj to the first node N1.

One electrode of the third transistor T3 may be connected to the jth sensing line SENLj, and the other electrode of the third transistor T3 may be connected to a second node N2. A gate electrode of the third transistor T3 may be connected to the ith sensing signal line SELi. In case that the third transistor T3 may be turned on in response to a sensing signal provided from the ith sensing signal line SELi, a reference voltage may be provided to the second node N2 through the jth sensing line SENLj.

In accordance with an embodiment, the reference voltage may function to set or initialize, to a constant value, a voltage of an electrode of the first transistor T1 (for example, a source electrode of the first transistor T1) connected to the light emitting element LD. In accordance with an example, the reference voltage may be set equal to or lower than a voltage of the second power line VSS.

In accordance with an embodiment, in case that the third transistor T3 is turned on in response to the sensing signal provided from the ith sensing signal line SELi, a sensing current may be transferred to the jth sensing line SENLj.

In accordance with an embodiment, the sensing current may be provided to the compensator 140. The sensing current may be used to calculate a mobility of the first transistor T1 and a variation of a threshold voltage of the first transistor T1.

The storage capacitor Cst may be connected between the first node N1 (or the gate electrode of the first transistor T1) and the second node N2 (or the other electrode of the first transistor T1). The storage capacitor Cst may store information on a difference between a voltage of the first node N1 and a voltage of the second node N2.

The structure of the pixel circuit PXC is not limited to that shown in FIG. 5, and various types of structures may be implemented.

Figure 6:
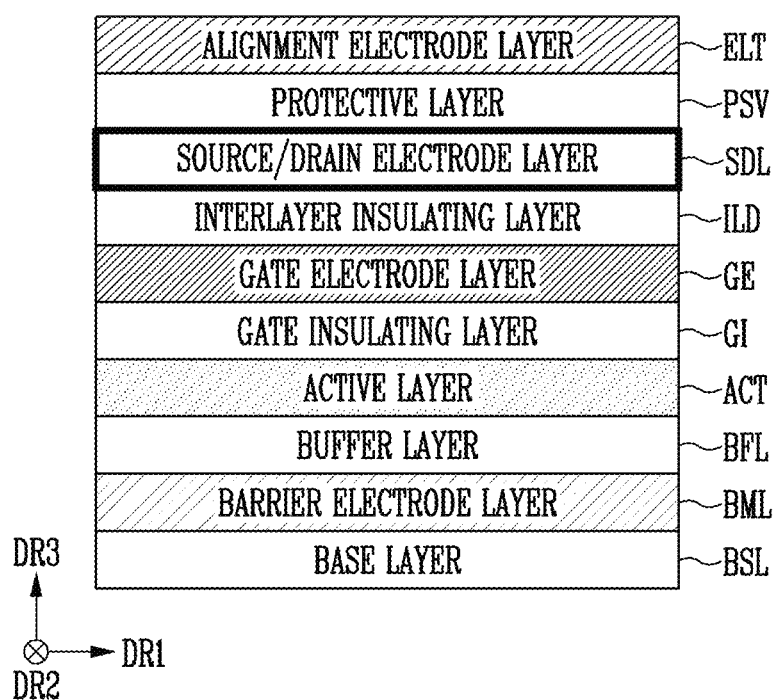
FIG. 6 is a diagram illustrating a stacked structure included in a display device in accordance with an embodiment.

FIG. 6 is a diagram illustrating a stacked structure included in a display device in accordance with an embodiment.

Referring to FIG. 6, the stacked structure included in the display device in accordance with the embodiment may have a form in which at least a portion is patterned in a structure in which a base layer BSL, a barrier electrode layer BML, a buffer layer BFL, an active layer ACT, a gate insulating layer GI, a gate electrode layer GE, an interlayer insulating layer ILD, a source or drain electrode layer SDL, a protective layer PSV, and an alignment electrode layer ELT may be sequentially stacked each other.

The base layer BSL constitutes a base member of the display device 100, and may mean a rigid or flexible substrate or film.

The buffer layer BFL may be dispose on the base layer BSL. The buffer layer BFL may mean a layer for preventing an impurity from being diffused into the active layer ACT including a semiconductor or preventing moisture from infiltrating into the active layer ACT. In accordance with an example, the buffer layer BFL may include at least one of silicon nitride ($SiN_x$), silicon oxide ($SiO_x$), silicon oxynitride ($SiO_xN_y$), and metal oxide such as aluminum oxide ($AlO_x$).

The active layer ACT may be a layer including a semiconductor. For example, the active layer ACT may include at least one of poly-silicon, amorphous silicon, and an oxide semiconductor. In accordance with an embodiment, the active layer ACT may constitute a channel of each of the transistors T1 to T3, and an impurity may be doped into a portion of the active layer ACT, which is in contact with the source or drain electrode layer SDL.

The barrier electrode layer BML, the gate electrode layer GE, the source or drain electrode layer SDL, and the alignment electrode layer ELT may be layers including a conductor. Each of the barrier electrode layer BML, the gate electrode layer GE, and the source or drain electrode layer SDL may be formed as a single layer or a multi-layer. In accordance with an embodiment, each of the barrier electrode layer BML, the gate electrode layer GE, and the source or drain electrode layer SDL may include any one of gold (Au), silver (Ag), aluminum (Al), molybdenum (Mo), chromium (Cr), titanium (Ti), nickel (Ni), neodymium (Nd), copper (Cu), and platinum (Pt), but the disclosure is not limited thereto.

The gate insulating layer GI, the interlayer insulating layer ILD, and the protective layer PSV may be respectively interposed between the active layer ACT, the gate electrode layer GE, the source or drain electrode layer SDL, and the alignment electrode layer ELT so as to electrically isolate the active layer ACT, the gate electrode layer GE, the source or drain electrode layer SDL, and the alignment electrode layer ELT from each other. In accordance with an embodiment, required electrode patterns may be electrically connected to each other through contact holes formed in the gate insulating layer GI, the interlayer insulating layer ILD, and the protective layer PSV.

In accordance with an embodiment, the gate insulating layer GI, the interlayer insulating layer ILD, and the protective layer PSV may include at least one of silicon nitride ($SiN_x$), silicon oxide ($SiO_x$), silicon oxynitride ($SiO_xN_y$), and aluminum oxide ($AlO_x$). In accordance with an embodiment, the gate insulating layer GI, the interlayer insulating layer ILD, and the protective layer PSV may include an organic material, and each of the gate insulating layer GI, the interlayer insulating layer ILD, and the protective layer PSV may be formed of a single layer or layers.

Hereinafter, a structure of the pixel PX will be described with reference to FIG. 7.

Figure 7:
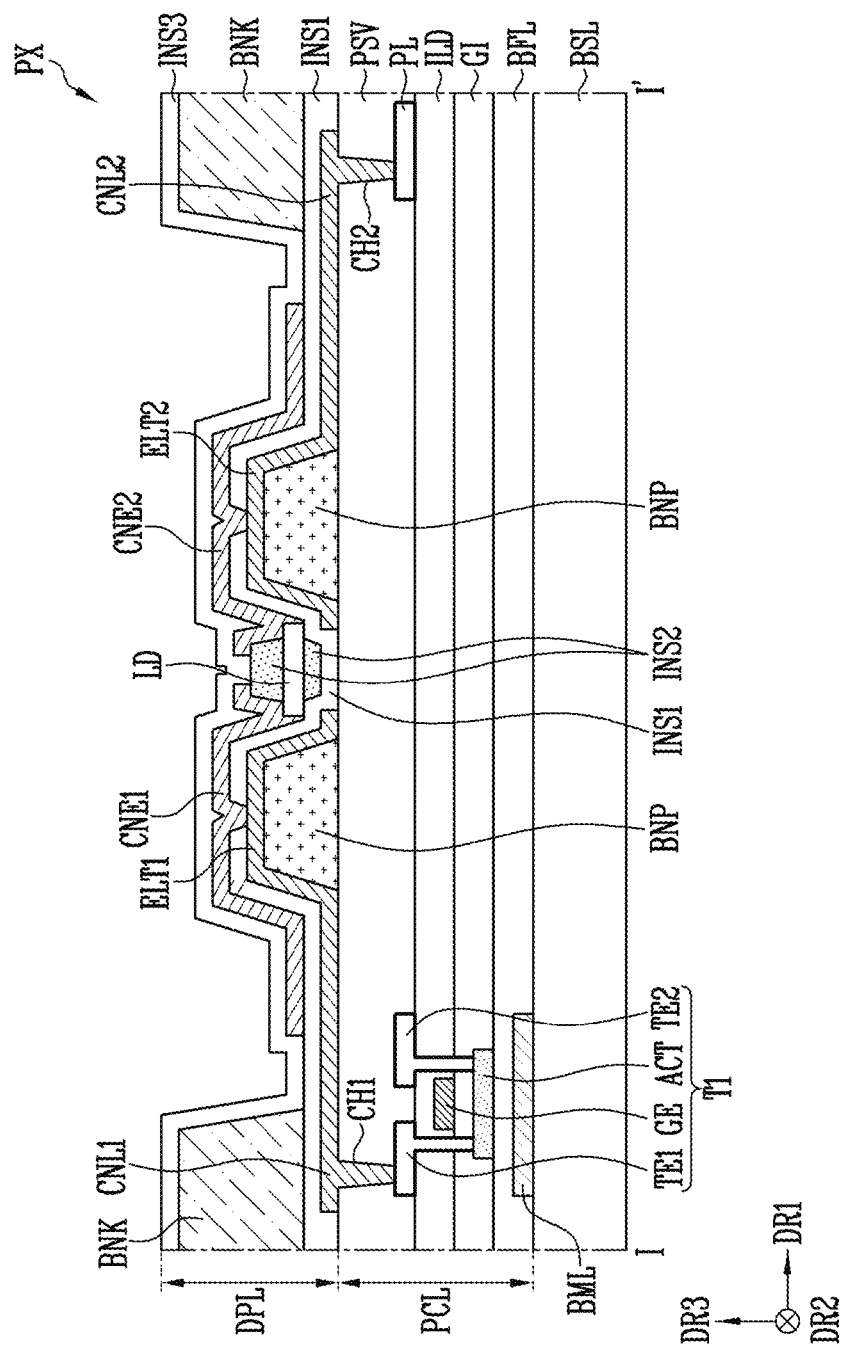
FIG. 7 is a schematic cross-sectional view taken along line I-I' shown in FIG. 4.

FIG. 7 is a schematic cross-sectional view taken along line I-I' shown in FIG. 4.

Referring to FIG. 7, the pixel PX may include a base layer BSL, a pixel circuit part PCL, and a display element part DPL. Hereinafter, for convenience of description, a first transistor T1 among first to third transistors T1 to T3 will be described. Portions identical to those described above are designated by like reference numerals, and descriptions of overlapping portions will be omitted or simplified.

The base layer BSL may constitute a base surface of the pixel PX as described above. The base layer BSL may mean a rigid or flexible substrate or film, but the disclosure is not limited thereto.

The pixel circuit part PCL may be disposed on the base layer BSL. The pixel circuit part PCL may include a buffer layer BFL, the first transistor T1, a gate insulating layer GI, an interlayer insulating layer ILD, a first contact hole CH1, a second contact hole CH2, and a protective layer PSV.

A base electrode layer BML, may be disposed on the base layer BSL.

The first transistor T1 may be a driving transistor. The first transistor T1 may include an active layer ACT, a gate electrode layer GE, a first transistor electrode TE1, and a second transistor electrode TE2.

The active layer ACT may be located or disposed on the buffer layer BFL. The active layer ACT may include at least one of poly-silicon, amorphous silicon, and an oxide semiconductor.

The active layer ACT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may be an intrinsic semiconductor pattern undoped with the impurity.

The gate insulating layer GI may be disposed over the active layer ACT.

The gate electrode layer GE may be disposed on the gate insulating layer GI. A position of the gate electrode layer GE may correspond to that of the channel region of the active layer ACT. For example, the gate electrode layer GE may be disposed on the channel region of the active layer ACT with the gate insulating layer GI interposed therebetween.

The interlayer insulating layer ILD may be disposed over the gate electrode layer GE.

The first transistor electrode TE1 and the second transistor electrode TE2 may be located or disposed on the interlayer insulating layer ILD. The first transistor electrode TE1 may be in contact with the first contact region of the active layer ACT while penetrating the interlayer insulating layer ILD and the gate insulating layer GI, and the second transistor electrode TE2 may be in contact with the second contact region of the active layer ACT while penetrating the interlayer insulating layer ILD and the gate insulating layer GI.

In accordance with an embodiment, the first transistor electrode TE1 may be electrically connected to a first connection line CNL1 through the first contact hole CH1. In accordance with an example, the first transistor electrode TE1 may be a source electrode, and the second transistor electrode TE2 may be a drain electrode.

A power line PL may be disposed on the interlayer insulating layer ILD. The power line PL may be electrically connected to a second connection line CNL2 through the second contact hole CH2 penetrating the protective layer PSV. In accordance with an embodiment, an electrical signal from the second power line VSS may be provided to the power line PL.

The protective layer PSV may be located or disposed on the interlayer insulating layer ILD. The protective layer PSV may cover or overlap the first transistor electrode TE1, the second transistor electrode TE2, and the power line PL.

The display element part DPL may be disposed on the pixel circuit part PCL. The display element part DPL may include a bank pattern BNP, a first electrode ELT1, a second electrode ELT2, a first insulating layer INS1, a light emitting element LD, a first contact electrode CNE1, a second contact electrode CNE2, a second insulating layer INS2, a bank BNK, and a third insulating layer INS3.

The bank pattern BNP may have a shape protruding in an upper direction. In accordance with an example, the upper direction may mean a display direction in which light is emitted from the light emitting element LD and/or the third direction DR3. The first electrode ELT1 and the second electrode ELT2 are arranged or disposed on the bank pattern BNP, so that a reflective partition wall or bank can be formed.

The first electrode ELT1 may be disposed on the protective layer PSV or the bank pattern BNP. The first electrode ELT1 may be a path through which an electrical signal applied through the first connection line CNL1 is provided. In accordance with an example, a power source supplied from the first power line VDD may be provided to the light emitting element LD via the first connection line CNL1 and the first electrode ELT1.

The second electrode ELT2 may be disposed on the protective layer PSV or the bank pattern BNP. The second electrode ELT2 may be a path through which an electrical signal applied through the second connection line CNL2 is provided. In accordance with an example, a power source supplied from the second power line VSS may be provided to the light emitting element LD via the power line PL, the second connection line CNL2, and the second electrode ELT2.

In accordance with an embodiment, the first electrode ELT1 and the second electrode ELT2 may be formed through a same process as the alignment electrode layer ELT described above with reference to FIG. 6.

The light emitting element LD may be disposed on the first insulating layer INS1. The first insulating layer INS1 may be disposed on the protective layer PSV. The first insulating layer INS1 may be disposed over the first electrode ELT1 and/or the second electrode ELT2. The first insulating layer INS1 may stabilize connection between electrode components, and decrease external influence. In accordance with an example, the first insulating layer INS1 may include at least one of silicon nitride ($SiN_x$), silicon oxide ($SiO_x$), silicon oxynitride ($SiO_xN_y$), and aluminum oxide ($AlO_x$).

The light emitting element LD may be disposed on the first insulating layer INS1 between the first electrode ELT1 and the second electrode ELT2. The light emitting element LD may be the light emitting element LD described above with reference to FIGS. 1 and 2.

The second insulating layer INS2 may be disposed on the light emitting element LD. The second insulating layer INS2 may cover or overlap the active layer 12 of the light emitting element LD. The second insulating layer INS2 may include any one of an organic material and an inorganic material. In accordance with an embodiment, the second insulating layer INS2 may fill a groove provided at a rear surface of the light emitting element LD.

The first contact electrode CNE1 and the second contact electrode CNE2 may be disposed on the first insulating layer INS1. The first contact electrode CNE1 and the second contact electrode CNE2 may be respectively connected electrically to the first electrode ELT1 and the second electrode ELT2 through contact holes formed in the first insulating layer INS1.

In accordance with an embodiment, the first contact electrode CNE1 and the second contact electrode CNE2 may include a conductive material. In accordance with an example, the first contact electrode CNE1 and the second contact electrode CNE2 may include a transparent conductive material including Indium Tin Oxide (ITO), Indium Zinc Oxide (IZO), and Indium Tin Zinc Oxide (ITZO).

In accordance with an embodiment, the light emitting element LD may emit light, based on an electrical signal provided from the first contact electrode CNE1 and the second contact electrode CNE2.

The bank BNK may be a structure defining an emission area of the pixel PX. The emission area may mean an area in which light is emitted from the light emitting element LD. For example, the bank BNK may be disposed at a boundary between adjacent pixels PX.

The third insulating layer INS3 may be arranged or disposed over the bank BNK, the first contact electrode CNE1, the second contact electrode CNE2, and the second insulating layer INS2. The third insulating layer INS3 may include any one of an organic material or an inorganic material. The third insulating layer INS3 may protect the display element part DPL from external influence.

The arrangement relationship of the light emitting element LD, the electrode components, and the like is not limited to the example described above with reference to FIG. 7, and arrangement relationships in accordance with various embodiments may be implemented.

Hereinafter, an electrode structure in the non-display area NDA in accordance with an embodiment will be described with reference to FIGS. 8 to 13. In an example, the fan-out area 300 in the non-display area NDA will be described.

Figure 8:
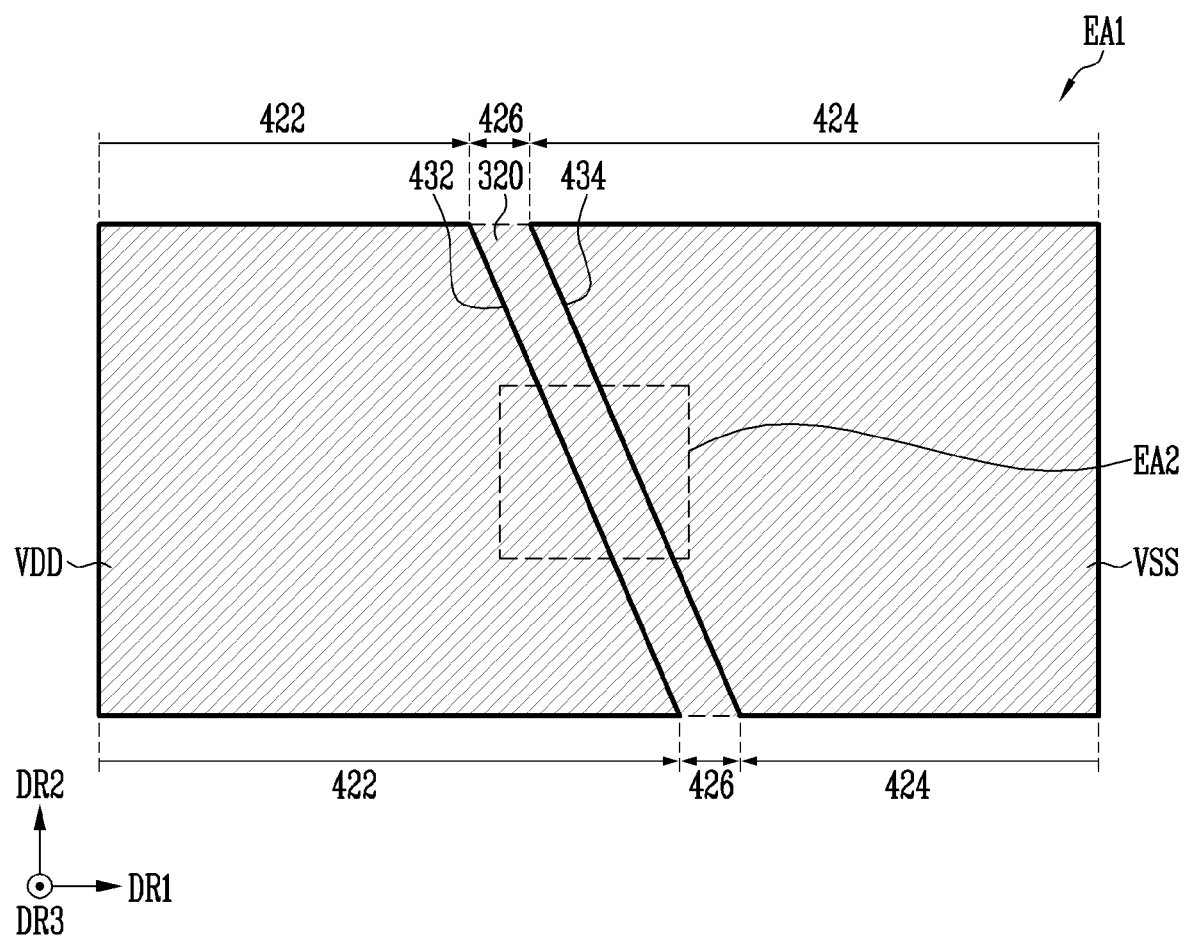
FIGS. 8 and 9 are enlarged views of area EA1 shown in FIG. 4.
Figure 9:
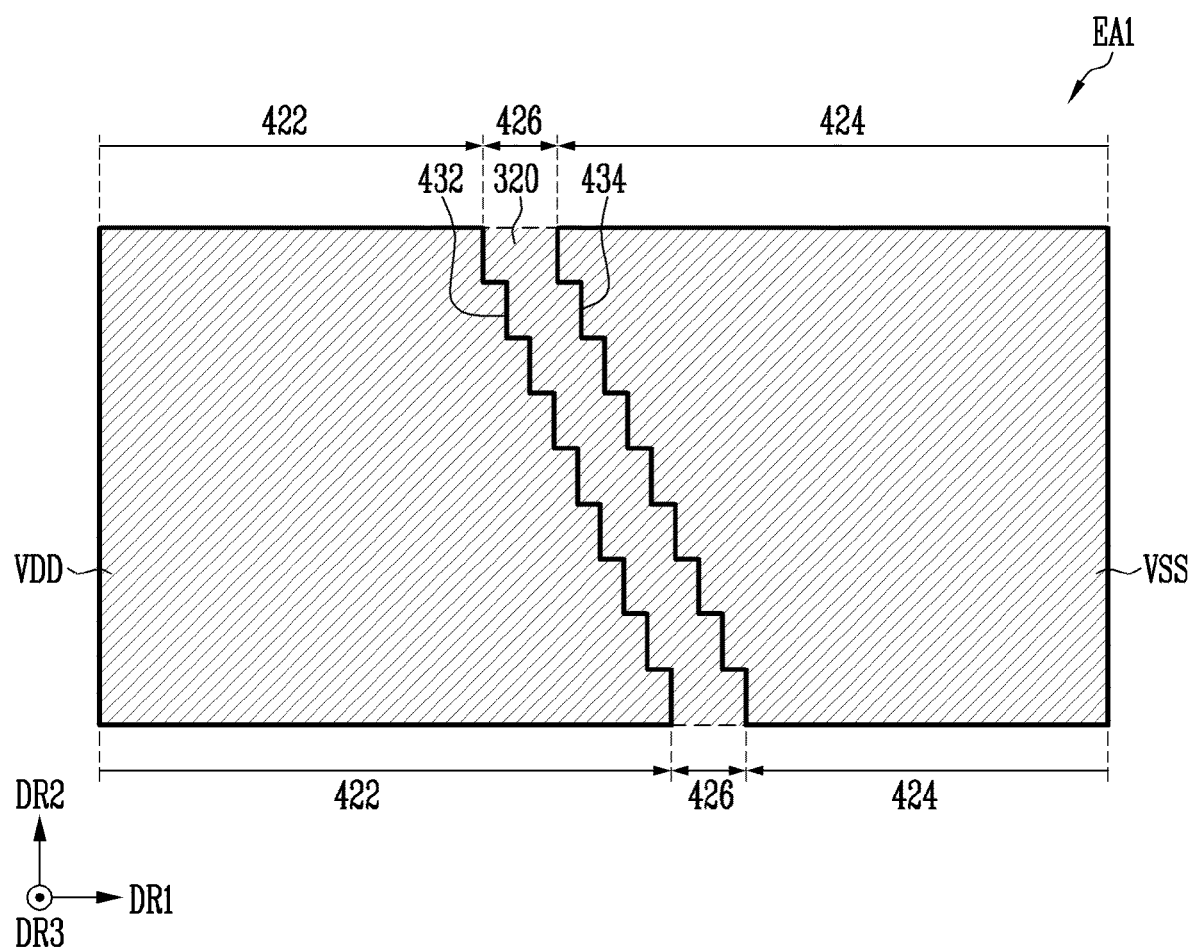

FIGS. 8 and 9 are enlarged views of area EA1 shown in FIG. 4. FIG. 8 is a schematic plan view illustrating a portion of the fan-out area 300 in accordance with an embodiment. FIG. 9 is a schematic plan view illustrating a portion of the fan-out area 300 in accordance with an embodiment.

Referring to FIG. 8, a first power line VDD, a second power line VSS, and a fan-out line 320 may be disposed in the fan-out area 300.

In accordance with an embodiment, the first power line VDD and the second power line VSS may be disposed in a same layer. For example, the first power line VDD and the second power line VSS may be disposed in a same layer as the source or drain electrode layer SDL. The first power line VDD and the second power line VSS may be formed through a same process.

In accordance with an embodiment, the fan-out line 320 may be disposed in a layer different from that of the first power line VDD and the second power line VSS. For example, the fan-out line 320 may be disposed in a same layer as the barrier electrode layer BML. The fan-out line 320 may be formed with the barrier electrode layer BML through a same process.

In accordance with an embodiment, each of the first power line VDD and the second power line VSS may have a plate shape or a substantially plate shape. Lines may be separated from the first power line VDD and the second power line VSS, and the separated lines may be connected to each pixel PX in the display area DA.

For example, the first power line VDD may be electrically connected to a line provided in the display area DA through a contact hole, and an electrical signal provided from the first power line VDD may be applied to the light emitting element LD. The second power line VSS may be electrically connected to a line provided in the display area DA through a contact hole, and an electrical signal provided from the second power line VSS may be applied to the light emitting element LD.

In accordance with an embodiment, in a plan view, the first power line VDD and the second power line VSS may not overlap each other in the fan-out area 300.

For example, the fan-out area 300 may include a first overlapping area 422, a second overlapping area 424, and a separation area 426. The first overlapping area 422 may mean an area in which the first power line VDD and the fan-out line 320 overlaps each other in a plan view. The second overlapping area 424 may mean an area in which the second power line VSS and the fan-out line 320 overlap each other in a plan view. The separation area 426 may mean an area in which the first power line VDD and the second power line VSS are not disposed.

Experimentally, in case that the first power line VDD and the second power line VSS overlap each other, a risk that a short-circuit defect will occur during a manufacturing process may exist. However, in accordance with this embodiment, the first power line VDD and the second power line VSS are formed in a same layer, and are formed to be spaced apart from each other at a distance, so that the risk that the short-circuit defect will occur can be decreased.

In accordance with an embodiment, in a plan view, the fan-out line 320 may be disposed in the first overlapping area 422, the second overlapping area 424, and/or the separation area 426. In FIG. 8, for convenience of description, it has been illustrated that the fan-out line 320 is arranged or disposed at the front of the fan-out area 300. However, in an embodiment, the fan-out line 320 may include lines spaced apart from each other. For example, referring to FIG. 10, the fan-out line 320 may be formed of lines which may be spaced apart from each other along or in the first direction DR1, and have at least a portion extending along the second direction DR2.

However, the disclosure is not limited thereto, and various arrangement forms may be implemented to constitute the fan-out area 300. For example, at least a portion of the fan-out line 320 in the fan-out area 300 may extend in the first direction DR1, and at least another portion of the fan-out line 320 in the fan-out area 300 may extend in the second direction DR2.

In accordance with an embodiment, the first overlapping area 422 and the second overlapping area 424 may not overlap each other, in a plan view. The first power line VDD and the second power line VSS may be spaced apart from each other with the separation area 426 interposed therebetween.

In accordance with an embodiment, the first power line VDD and the second power line VSS may be spaced apart from each other. For example, the first power line VDD may include a first adjacent line 432 disposed adjacent to the second power line VSS, and the second power line VSS may include a second adjacent line 434 disposed adjacent to the first power line VDD.

In accordance with an embodiment, the first adjacent line 432 and the second adjacent line 434 may not overlap each other, in a plan view. In accordance with an example, the first adjacent line 432 and the second adjacent line 434 may be formed in parallel to each other.

In accordance with an embodiment, the separation area 426 may extend obliquely. The separation area 426 may be defined by the first power line VDD and the second power line VSS. For example, the shape of the separation area 426 may be defined by the first adjacent line 432 of the first power line VDD and the second adjacent line 434 of the second power line VSS. In accordance with an example, at least a portion of the separation area 426 may extend in an oblique direction, and the oblique direction may be non-parallel to one surface or a surface of the display device 100. This will be described with reference to FIG. 8 in conjunction with FIG. 4. One side or a side of the display device 100, to which the driving controller D-IC is disposed adjacent may extend in the first direction DR1, and the oblique direction may be formed to be at least dislocated from the first direction DR1. The first adjacent line 432 and the second adjacent line 434 may be at least non-parallel to the first direction DR1.

However, the shape of the first power line VDD and the second power line VSS is not limited thereto. A shape of the first power line VDD and the second power line VSS in accordance with an embodiment will be described with reference to FIG. 9.

In accordance with an embodiment, the first power line VDD and the second power line VSS may have a stepped shape or substantially stepped shape. For example, the first adjacent line 432 and the second adjacent line 434 may be implemented in a stepped shape or substantially stepped shape.

In accordance with an embodiment, the first adjacent line 432 and the second adjacent line 434 may extend unequally. The first adjacent line 432 and the second adjacent line 434 may not have any linear shape extending equally.

For example, the first adjacent line 432 may include a (1-1)th protrusion part and a (1-2)th protrusion part different from the (1-1)th protrusion part. Similarly, the second adjacent line 434 may include a (2-1)th protrusion part and a (2-2)th protrusion part different from the (2-1)th protrusion part.

Hereinafter, the first power line VDD, the second line VSS, and the fan-out line 320 will be described in more detail with reference to FIGS. 10 and 12.

Figure 10:
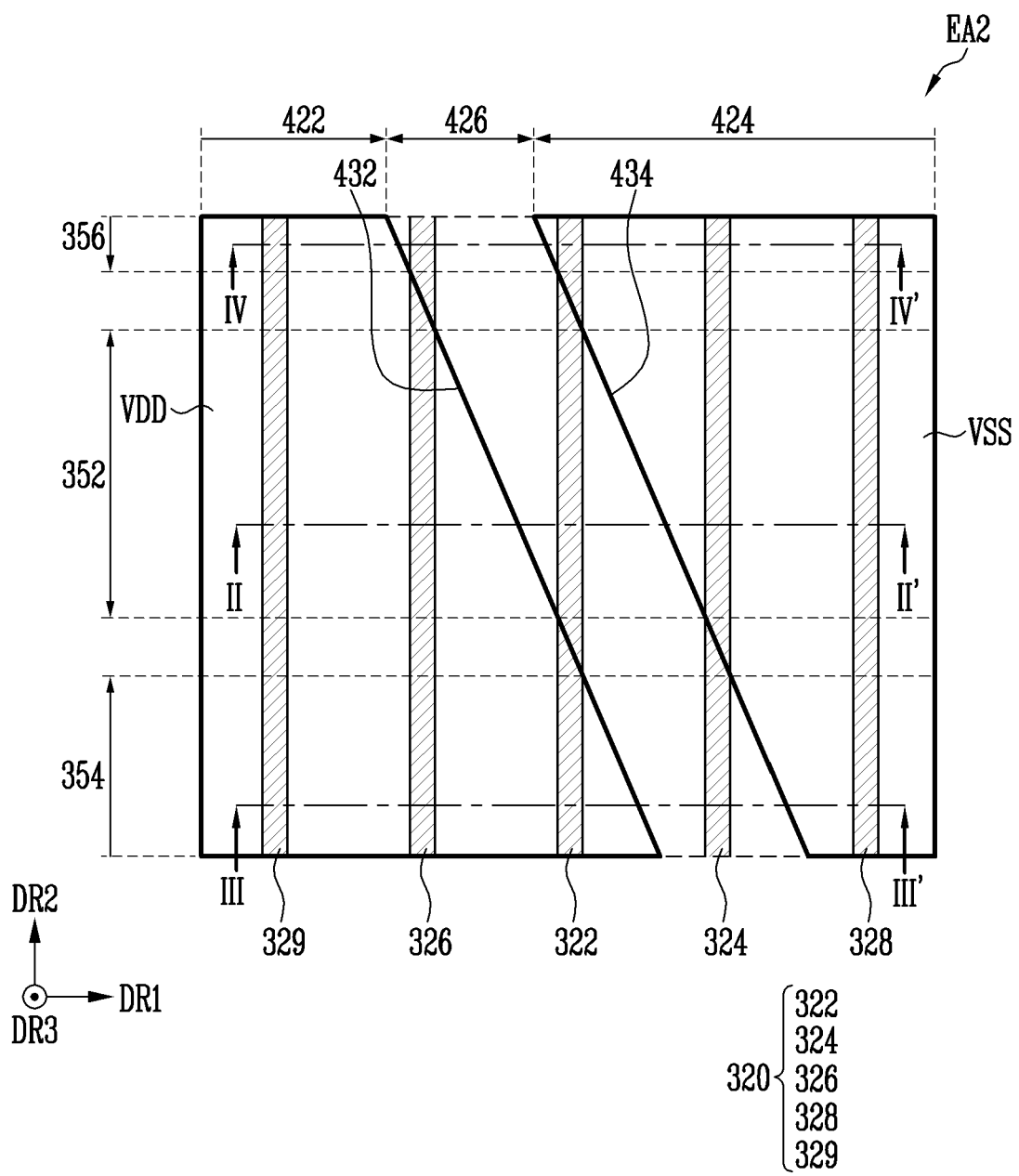
FIG. 10 is an enlarged view of area EA2 shown in FIG. 8.

FIG. 10 is an enlarged view of area EA2 shown in FIG. 8. FIG. 11 is a schematic cross-sectional view taken along line II-IF shown in FIG. 10. FIG. 12 is a schematic cross-sectional view taken along line shown in FIG. 10. FIG. 13 is a schematic cross-sectional view taken along line IV-IV' shown in FIG. 10.

Referring to FIGS. 10 to 13, the separation area 426 may overlap at least a portion of the fan-out line 320. The fan-out line 320 may be provided in plural, and each of the plural fan-out lines 320 may have different positions at which the plural fan-out lines 320 overlap the separation area 426.

In accordance with an embodiment, the fan-out lines 320 may correspond to at least one of the scan line SL, the data line DL, and the sensing line SENL, but the disclosure is not limited thereto. In an example, the fan-out lines 320 may correspond to at least one of lines for providing an electrical signal applied in the pixel PX in the display area DA.

Hereinafter, an embodiment the fan-out line 320 may include a first fan-out line 322, a second fan-out line 324, a third fan-out line 326, a fourth fan-out line 328, and a fifth fan-out line 329 will be described.

In accordance with an embodiment, the first fan-out line 322, the second fan-out line 324, the third fan-out line 326, the fourth fan-out line 328, and the fifth fan-out line 329 may be spaced apart from each other in the first direction DR1, and have a shape extending in the second direction DR2. At least a portion of each of the first fan-out line 322, the second fan-out line 324, the third fan-out line 326, the fourth fan-out line 328, and the fifth fan-out line 329 may have a shape extending in the second direction DR2.

The fan-out area 300 may include a first area 352, a second area 354, and a third area 356. The first area 352, the second area 354, and the third area 356 may be distinguished from each other according to a direction in which an electrical signal of the fan-out line 320 is transferred. In an example, the first area 352, the second area 354, and the third area 356 may be distinguished from each other along the second direction DR2. The second direction DR2 may mean a direction toward the display area DA from the driving controller D-IC, in case that referring to FIG. 4.

FIG. 11 is a schematic cross-sectional view illustrating the first area 352 in the fan-out area 300. FIG. 12 is a schematic cross-sectional view illustrating the second area 354 in the fan-out area 300. FIG. 13 is a schematic cross-sectional view illustrating the third area 356 in the fan-out area 300.

Referring to FIGS. 10 and 11, in the first area 352, the separation area 426 may overlap the first fan-out line 322, in a plan view.

In accordance with an embodiment, in the first area 352, the separation area 426 may not overlap the second fan-out line 324, the third fan-out line 326, the fourth fan-out line 328, and the fifth fan-out line 329.

In accordance with an embodiment, in the first area 352, the first overlapping area 422 may overlap the third fan-out line 326 and the fifth fan-out line 329, in a plan view.

In accordance with an embodiment, in the first area 352, the second overlapping area 424 may overlap the second fan-out line 324 and the fourth fan-out line 328, in a plan view.

Figure 12:
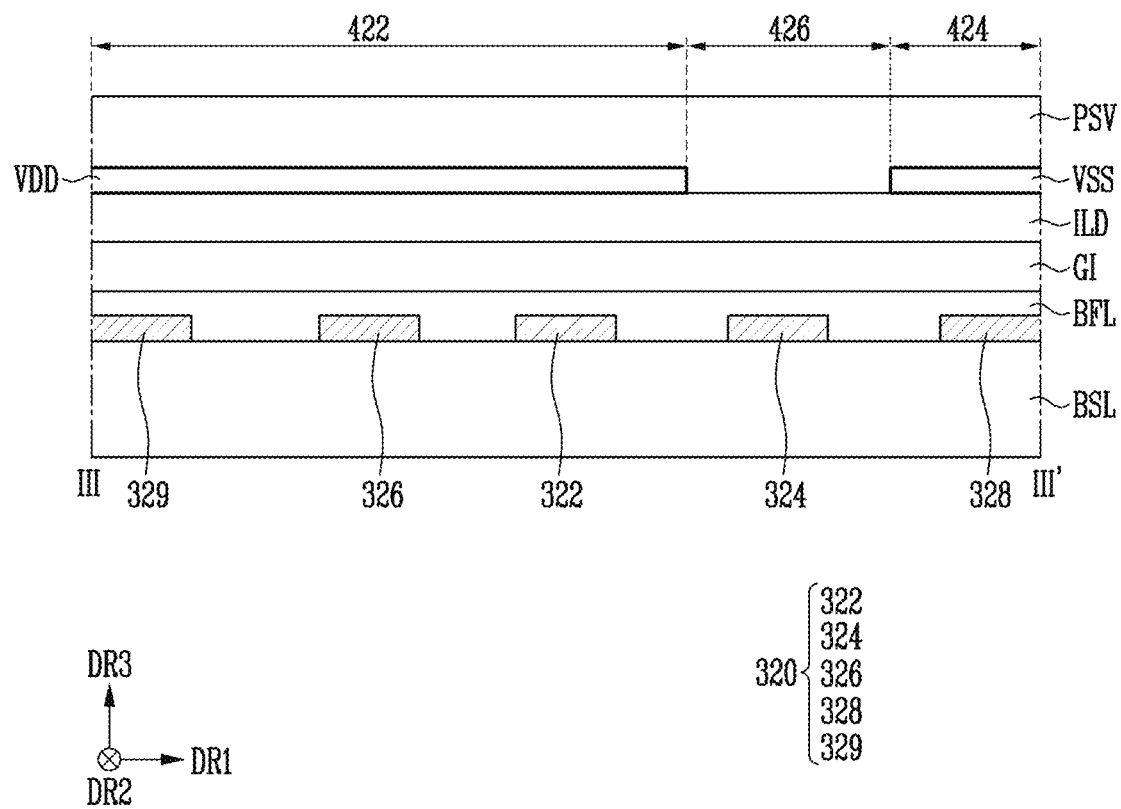
FIG. 12 is a schematic cross-sectional view taken along line shown in FIG. 10.

Referring to FIGS. 10 and 12, in the second area 354, the separation area 426 may overlap the second fan-out line 324, in a plan view.

In accordance with an embodiment, in the second area 354, the separation area 426 may not overlap the first fan-out line 322, the third fan-out line 326, the fourth fan-out line 328, and the fifth fan-out line 329.

In accordance with an embodiment, in the second area 354, the first overlapping area 422 may overlap the first fan-out line 322, the third fan-out line 326, and the fifth fan-out line 329, in a plan view.

In accordance with an embodiment, in the second area 354, the second overlapping area 424 may overlap the fourth fan-out line 328, in a plan view.

Referring to FIGS. 10 and 13, in the third area 356, the separation area 426 may overlap the third fan-out line 326, in a plan view.

In accordance with an embodiment, in the third area 356, the separation area 426 may not overlap the first fan-out line 322, the second fan-out line 324, the fourth fan-out line 328, and the fifth fan-out line 329.

In accordance with an embodiment, in the third area 356, the first overlapping area 422 may overlap the fifth fan-out line 329, in a plan view.

In accordance with an embodiment, in the third area 356, the second overlapping area 424 may overlap the first fan-out line 322, the second fan-out line 324, and the fourth fan-out line 328, in a plan view.

In accordance with an embodiment, the fan-out line 320 overlapping the separation area 426 may not be covered or overlapped by the first power line VDD and/or the second power line VSS.

Experimentally, physical data of the fan-out line 320 may be differently provided according to the range of an area overlapping the separation area 426. For example, in case that a first line as any one of the fan-out lines 320 overlap the separation area 426 by a first range, the first line may have a first resistance. In case that the first line overlaps the separation area 426 by a second range different from the first range, the first line may have a second resistance different from the first resistance. There exists a probability that distortion of an electrical signal passing through the fan-out line 320 will occur, and therefore, a risk that an image quality deviation of the display device 100 will occur may exist.

However, in accordance with the embodiment, the kind of a target line overlapping the separation area 426 may be changed according to the position of the fan-out area 300 (for example, the first area 352, the second area 354, and the third area 356). Thus, a physical data (for example, resistance) difference generated due to the separation area 426 can be provided to be distributed to all of the fan-out lines 320. As a result, the distortion of the electrical signal passing through the fan-out line 320 can be prevented. Accordingly, the image quality deviation of the display device 100 can be minimized.

In accordance with the disclosure, there can be provided a display device which can decrease a resistance deviation for each of positions of lines and prevent a short-circuit defect between electrode components.

Example embodiments have been disclosed herein, and although terms are employed, they are used and are to be interpreted in a generic and descriptive sense only and not for purpose of limitation. In some instances, as would be apparent to one of ordinary skill in the art, features, characteristics, and/or elements described in connection with a given embodiment may be used singly or in combination with features, characteristics, and/or elements described in connection with other embodiments unless otherwise indicated. Accordingly, it will be understood by those of ordinary skill in the art that various changes in form and details may be made without departing from the spirit and scope of the disclosure as set forth in the following claims.

What is claimed is:

1. A display device comprising:
a display area and a non-display area adjacent to the display area;
a pixel disposed in the display area;
a driving controller disposed in the non-display area, the driving controller controlling driving of the pixel; and
a line part having at least a portion disposed in the non-display area, the line part electrically connecting the pixel and the driving controller to each other between the pixel and the driving controller, wherein
the non-display area includes a fan-out area disposed between the display area and the driving controller,
the line part includes:
a first power line;
a second power line; and
a fan-out line,
at least a portion of each of the first power line, the second power line, and the fan-out line are disposed in the fan-out area,
at least a portion of the first power line and at least a portion of the second power line are, throughout a common area within the fan-out area, disposed in a same layer, immediately adjacent to one another, and spaced apart from each other by a separation area extending in an oblique direction in a plan view,
a width of both the first power line and the second power line is greater than a width of the separation area in plan view throughout the common area, and
a side of the display device adjacent to the driving controller, and the oblique direction are non-parallel to each other.

2. The display device of claim 1, wherein
the width of each of the first power line, the second power line, and the separation area is determined along a direction parallel to the side of the display device, and
an edge of the first power line abutting the separation area is parallel to an edge of the second power line abutting the separation area in plan view.

3. The display device of claim 2, wherein
the fan-out line is disposed in a different layer than the first power line and the second power line and overlaps the first power line, the second power line, and the separation area in plan view in the common area.

4. The display device of claim 2, wherein the first power line and the second power line are dislocated from the side of the display device adjacent to the driving controller.

5. The display device of claim 2, wherein the first power line and the second power line have a stepped shape.

6. The display device of claim 1, wherein the first power line and the second power line are disposed in a same layer different from a layer of the fan-out line.

7. The display device of claim 6, further comprising:
a transistor electrically connected to the driving controller, the transistor including a first transistor electrode and a second transistor electrode,
wherein the first transistor electrode, the second transistor electrode, the first power line, and the second power line are disposed in a same layer.

8. The display device of claim 7, further comprising:
a barrier electrode layer overlapping at least a portion of the transistor in a plan view,
wherein the barrier electrode layer and the fan-out line is disposed in a same layer.

9. The display device of claim 1, wherein at least a portion of the fan-out line overlaps the separation area in a plan view.

10. The display device of claim 2, wherein
the fan-out line includes:
a first fan-out line;
a second fan-out line; and
a third fan-out line,
the first fan-out line, the second fan-out line, and the third fan-out line are spaced apart from each other in a first direction, and
at least a portion of each of the first fan-out line, the second fan-out line, and the third fan-out line extends in a second direction.

11. The display device of claim 10, wherein
the fan-out area includes a first area, a second area, and a third area,
the first area, the second area, and the third area are spaced apart from each other in the second direction in a plan view, and
the first area is disposed between the second area and the third area.

12. The display device of claim 10, wherein the second direction is a direction toward the display area from the driving controller.

13. The display device of claim 11, wherein
the fan-out area includes a first overlapping area and a second overlapping area, and
the first power line overlaps the fan-out line in the first overlapping area, and
the second power line overlaps the fan-out line in the second overlapping area.

14. The display device of claim 13, wherein
the first fan-out line overlaps the separation area in the first area in a plan view, and
the second fan-out line and the third fan-out line do not overlap the separation area in the first area in a plan view.

15. The display device of claim 14, wherein
the second fan-out line overlaps the separation area in the second area in a plan view, and
the first fan-out line and the third fan-out line do not overlap the separation area in the second area in a plan view.

16. The display device of claim 15, wherein
the third fan-out line overlaps the separation area in the third area in a plan view, and
the first fan-out line and the second fan-out line do not overlap the separation area in the third area in a plan view.

17. The display device of claim 13, wherein
the second fan-out line overlaps the second overlapping area, and the third fan-out line overlaps the first overlapping area in a plan view in the first area,
the first fan-out line overlaps the first overlapping area, and the third fan-out line overlaps the first overlapping area in a plan view in the second area, and
the first fan-out line overlaps the second overlapping area, and the second fan-out line overlaps the second overlapping area in a plan view in the third area.

18. The display device of claim 1, wherein
the driving controller drives the pixel and includes:
a scan driver;
a data driver; and
a compensator, and
the scan driver, the data driver, and the compensator are disposed at a side of the display area.

19. The display device of claim 1, wherein a width of the fan-out area is widened in a direction towards the display area from the driving controller.

20. The display device of claim 1, wherein the fan-out line includes at least one of a scan line, a data line, or a sensing line, electrically connected to the pixel.

* * * * *